(12) United States Patent
Zhao et al.

(10) Patent No.: US 6,734,099 B2
(45) Date of Patent: May 11, 2004

(54) SYSTEM FOR PREVENTING EXCESS SILICON CONSUMPTION IN ULTRA SHALLOW JUNCTIONS

(75) Inventors: Jin Zhao, Plano, TX (US); Jiong-Ping Lu, Richardson, TX (US); Yuqing Xu, Plano, TX (US)

(73) Assignee: Texas Insturments Incorporated, Dallas, TX (US)

( * ) Notice: Subject to any disclaimer, the term of this patent is extended or adjusted under 35 U.S.C. 154(b) by 0 days.

(21) Appl. No.: 10/315,499

(22) Filed: Dec. 10, 2002

(65) Prior Publication Data

US 2003/0124827 A1 Jul. 3, 2003

Related U.S. Application Data

(60) Provisional application No. 60/344,665, filed on Dec. 28, 2001.

(51) Int. Cl.[7] .................... H01L 21/44; H01L 21/3205; H01L 21/336
(52) U.S. Cl. .................. 438/656; 438/301; 438/655; 438/660; 438/682; 438/683; 438/592
(58) Field of Search .................. 438/597, 649, 438/595, 643, 648, 636, 680

(56) References Cited

U.S. PATENT DOCUMENTS

| | | | |
|---|---|---|---|
| 5,989,988 A | * 11/1999 | Iinuma et al. | 438/592 |
| 6,001,718 A | * 12/1999 | Katata et al. | 438/592 |
| 6,180,519 B1 | * 1/2001 | Kuroi et al. | 438/649 |
| 6,303,483 B1 | * 10/2001 | Kunikiyo | 438/592 |

* cited by examiner

Primary Examiner—John F. Niebling
Assistant Examiner—Ron Pompey
(74) Attorney, Agent, or Firm—Peter K. McLarty; W. James Brady III; Frederick J. Telecky Jr.

(57) ABSTRACT

The present invention provides a system for preventing excess silicon consumption in a semiconductor wafer by depositing a metal layer (114) on top of a native oxide layer above a silicide layer (110) of the semiconductor wafer and then reducing the native oxide layer to form low resistance contacts. The native oxide layer is reduced using a rapid thermal annealing process within a temperature range to preserve the integrity of the silicide layer (110) and reduce excess silicon consumption. The temperature range can be greater than 350° C. and less than 615° C., but is optimal between 485° C. to 550° C.

19 Claims, 21 Drawing Sheets

SYSTEM FOR PREVENTING EXCESS SILICON CONSUMPTION IN ULTRA SHALLOW JUNCTIONS

PRIORITY CLAIM

This patent application claims priority of U.S. Provisional Application No. 60/344,665, filed on Dec. 28, 2001.

TECHNICAL FIELD OF THE INVENTION

The present invention relates generally to the field of semiconductor devices, and more particularly to a system for preventing excess silicon consumption in ultra shallow junctions.

BACKGROUND OF THE INVENTION

As CMOS devices scaled to the 0.1 um regime, the self-aligned silicide (SALICIDE) contact technology increasingly becomes an integrated part of the ultra-shallow junctions and Si consumption in shallow junctions due to silicide contacts becomes a critical issue. A lower Si consumption is desirable and essential to the formation of ultra-shallow source and drain junctions in deep sub-micron CMOS transistors. Although many efforts to minimize Si consumption during the silicidation process have been reported, little is know about the extra Si consumption induced by the post-silicide processes.

$TiSi_2$, $CoSi_2$ and NiSi are three most important silicide systems for CMOS fabrication. Although $TiSi_2$ is widely used in 0.25 um technology node and above, the line width dependence of phase transformation limits its application for sub-0.25 um technology nodes. NiSi is independent of line width and consumes the least amount of Si for NiSi formation (the mono-silicide is a low resistivity phase as compared with low resistivity disilicide phase for Co and Ti). However, NiSi is also the least stable silicide. Temperatures of back end processing steps after NiSi formation needs to be kept below 600° C. to prevent NiSi silicide agglomeration and transformation into the high resistivity thermodynamically stable phase of $NiSi_2$. $CoSi_2$ does not suffer from the line width dependence effect and is stable for the thermal budget used in most CMOS devices. It is currently the dominant silicide used in SALICDE application. The main disadvantage of $CoSi_2$ is that it consumes the most of Si during silicide formation among the three common silicides. For every 1 nm silicide formed, Si consumption for $CoSi_2$ is 1.04 nm, which is more than $TiSi_2$ (0.9 nm) and NiSi (0.82 nm). Si consumption is defined as the distance between the initial silicon interface and the base of the silicide. As the source/drain junctions are getting shallower, Si consumption becomes a limiting factor for the extendibility of $CoSi_2$ process. As a result, there is a need for a system to prevent excess silicon consumption in ultra shallow junctions.

SUMMARY OF THE INVENTION

Ti deposition and its subsequent thermal process (rapid thermal annealing (RTA) at temperatures equal to or greater than 615° C.) induce excess Si consumption in addition to those consumed during the original silicidation process. Specifically, Ti atoms can destroy the integrity of the original $CoSi_2$ layer by taking Si from Co to form $TiSi_2$. The Si-poor Co atoms then diffuse to the junction to react with more Si to form $CoSi_2$. In this process, more Si is consumed in addition to those consumed in the original silicidation process. The present invention provides a mechanism for reducing excess Si consumption using a process window where Ti layer can be used for reducing interfacial oxide to reduce contact resistance, while preventing the extra Si consumption. When optimal RTA temperature window is used between 485° C. and 550° C., the interfacial oxide is reduced to form low resistance contacts, while the RTA temperature is low enough to preserve the integrity of the original $CoSi_2$ layer. This temperature window can be extended to as high as less than 615° C. and as low as 350° C. based on current processes or other temperature above the backend process steps with reduced effectiveness. This process may also be used in $Ti/CoSi_2/Si$ multilayer systems.

More specifically, the present invention provides a system for preventing excess silicon consumption in a semiconductor wafer by depositing a metal layer on top of a native oxide layer above a silicide layer of the semiconductor wafer and then reducing the native oxide layer to form low resistance contacts. The native oxide layer is reduced using a rapid thermal annealing process within a temperature range to preserve the integrity of the silicide layer and reduce excess silicon consumption. The temperature range can be greater than 350° C. and less than 615° C., but is optimal between 485° C. to 550° C.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The invention will now be described in conjunction with a n-type transistor using a CMOS process. It will be apparent to those of ordinary skill in the art that the benefits of the invention may be applied to other CMOS processes (as well as nMOS and pMOS), and transistor sizes. It will also be apparent to those of ordinary skill in the art that the invention may be applied to p-type transistors by reversing the conductivity types. The specific embodiments discussed herein are merely illustrative of specific ways to make and use the invention and do not limit the scope of the invention.

A CoSi$_2$ surface is frequently, if not always, covered with a native oxide layer, mainly SiO$_2$, as soon as it is exposed to air. This makes the contact resistance high. The most commonly used method to reduce the contact resistance is to deposit a thin Ti layer followed by high temperature (>700° C.) rapid thermal annealing (RTA) to reduce contact resistance. Excess Si consumption happens during the high temperature RTA of Ti/CoSi$_2$ stack. These backend processes can cause excess Si consumption of approximately 30% more than that of the original silicide formation. As will be illustrated below, the mechanism of the excess Si consumption during the high temperature RTA is elucidated by TOF-SIMS, XPS and TEM cross-section analyses.

The present invention demonstrates that this excess Si consumption from ultra-shallow junctions can be prevented by optimizing the temperature window of the contact loop process, while at the same time reducing the interface oxide, which is contrary to conventional and well established practices of wafer fabrication. By annealing the Ti—CoSi$_2$ interfacial system at a temperature between 485° C. and 550° C., Ti reacts with the interface oxide and eliminates the high resistivity layer at the interface. The anneal temperature is chosen to be low enough to prevent TiSi$_2$ formation and maintain the integrity of the CoSi$_2$ layer. In such a case, no excess Si consumption takes place. The present invention works in any situation involving SiO$_x$. In some applications, it may be desirable to use an anneal temperature outside the optimal range in order to satisfy other fabrication parameters. As a result, some excess Si consumption would be acceptable. For example, this temperature window can be extended to as high as less than 615° C. and as low as 350° C. based on current processes or other temperature above the backend process steps.

Figure 1:
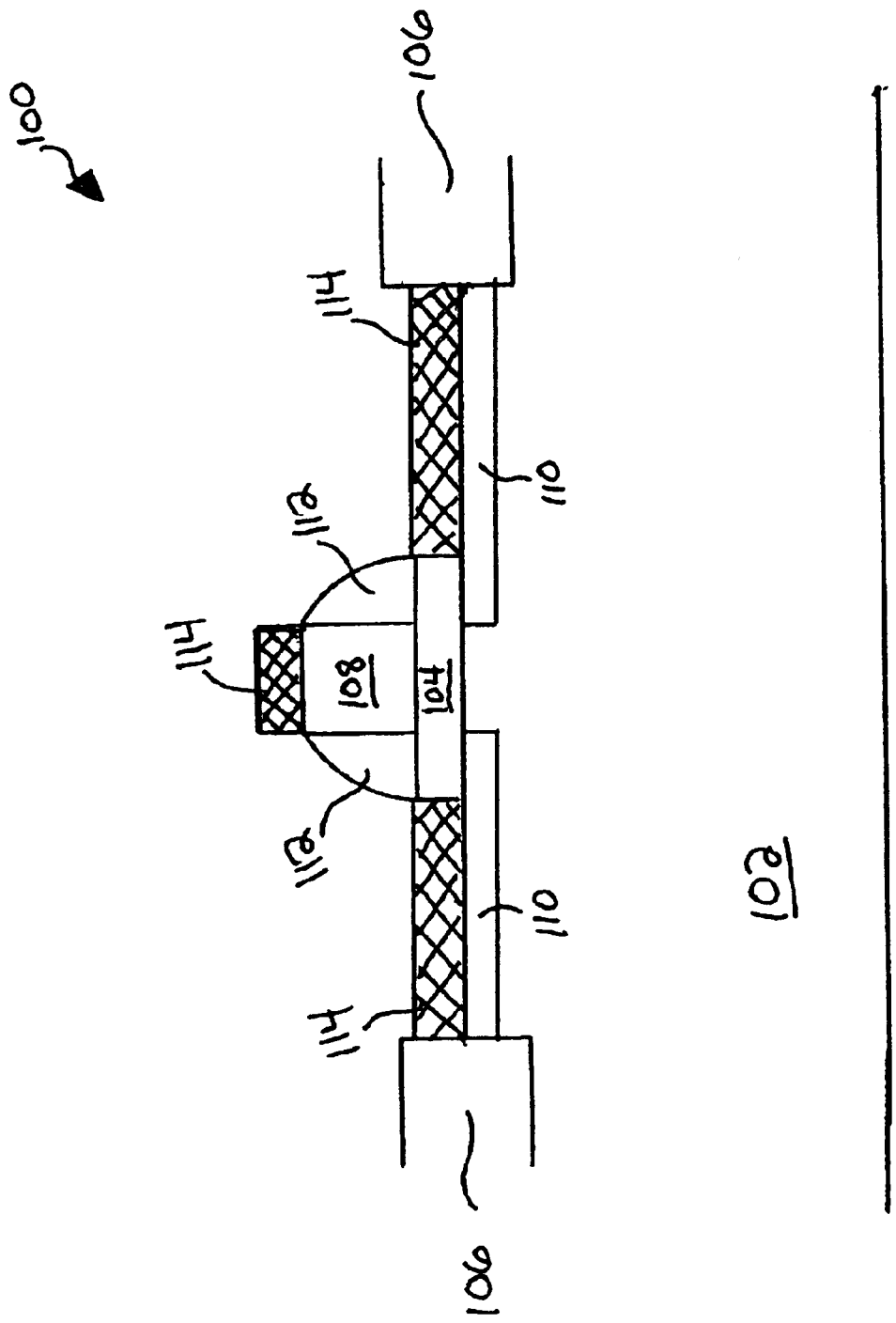
FIG. 1 shows a cross section of a CMOS transistor prior to the application of dielectric and metalization layers in accordance with the present invention.

Now referring to FIG. 1, a cross section of a CMOS transistor 100 prior to the application of dielectric and metalization layers in accordance with the present invention is shown. The substrate 102 is processed through the formation of isolation regions 106 and any well implants 110 and threshold adjust implants 104 as is well known in the art. A gate structure 108 is formed on the threshold adjust implant or gate isolation layer 104 above the substrate 102. Gate structure 108 may comprise a gate electrode and gate dielectric or a disposable gate structure as is known in the art. If the gate electrode and dielectric are formed at this point (as opposed to a disposable gate), the gate dielectric may be a remote-plasma nitrided oxide for smaller (about 0.1 micron) transistors. Other gate dielectric materials suitable include oxide or nitrided oxide by means other than remote-plasma nitridation. The gate pattern/etch may be accomplished with a deep UV surface-imaging lithography with linewidth reduction etch to achieve a short gate length.

Thin sidewall spacers 112 are then formed on the sidewalls of gate structure 108. Prior to formation of sidewall spacers 112, a thin thermal oxide of thickness 3–6 nanometers may be formed during a gate sidewall-reoxidation process to in part repair any gate etch damage to the underlying gate oxide. This thin thermal oxide from the sidewall re-oxidation process is not shown. Similarly, after formation of sidewall spacers 112, a thin thermal oxide of thickness about 2–3 nm may be formed if desired as a screen oxide before a subsequent implantation processes. Spacers 112 comprise a blocking material, preferably silicon nitride or silicon carbide. However, they may comprise any material having a smaller implant range than the substrate. The material is chosen to reduce the implant range of dopants thus preventing dopants from reaching the surface of substrate 102 under the spacer 118 during a subsequent implantations. The material may also reduce the lateral extension of dopants from the drain extension edge inwards to the channel at the surface of substrate 102 during subsequent implantation.

As previously mentioned, the silicide (CoSi$_2$) surface is always covered with a native oxide layer, mainly SiO$_2$, as soon as it is exposed to air. This makes the contact resistance high. A thin layer 114 of metal, such as Ti, Co, W, Ni, Pt or other acceptable material is deposited on these surfaces. The wafer is then subjected to RTA, which causes the Ti or other acceptable material to react with the interface oxide and eliminate the high resistivity layer at the interface, thus reducing the contact resistance. If the temperature of the RTA exceeds approximately 550° C., excess Si consumption will occur. The optimal temperature of the RTA to reduce excess Si consumption is between 485° C. and 550° C. The RTA temperature is chosen to be low enough to prevent $TiSi_2$ formation and maintain the integrity of the $CoSi_2$ layer. In such a case, little to no excess Si consumption takes place. The present invention will work in any situation involving $SiO_x$. In some applications, it may be desirable to use an anneal temperature outside the optimal range in order to satisfy other fabrication parameters. As a result, some excess Si consumption would be acceptable. For example, this temperature window can be extended to as low as 350° C. based on current processes, or other temperature above the backend process steps. The remaining process steps to fabricate the device are well known in the art and will depend on the device being fabricated and the application for which it will be used.

Specific embodiments and applications of the present invention are hereafter described in greater detail. 200 Å IMP (ion metal plasma) Ti was deposited on as-received blanket $CoSi_2$ wafers in an AMAT Endura 5500 system with a background pressure of $1 \times 10^{-9}$ torr. The wafers were then processed through rapid thermal annealing (RTA) at different temperatures for 30 seconds. The samples were then characterized by X-ray photoelectron spectroscopy (XPS), time of flight secondary ion mass spectrometry (TOF-SISM) and transmission electron microscope (TEM). TOF-SIMS has better depth resolution than XPS, while XPS has advantage in quantifying relative atomic concentrations. The combination of XPS and TOF-SIMS results provides more complete chemical information on the interfacial systems, which is complemented by structural information obtained from TEM. XPS analysis was carried out in a Physical Electronic/5700 system using monochromated Al Ka radiation. Binding energies were calibrated by setting Co $2p_{3/2}$ binding energy of $CoSi_2$ as 779.0 eV. TOF-SIMS analysis was carried out in a Physical Electronic/TRIFT I system using $Cs^+$ ion for both sputtering and data acquisition. To minimize matrix effect, $CsX^+$ ion was monitored, where X is the species of interest. For TEM analysis, an FEI CM200 system was used.

Figure 2A:
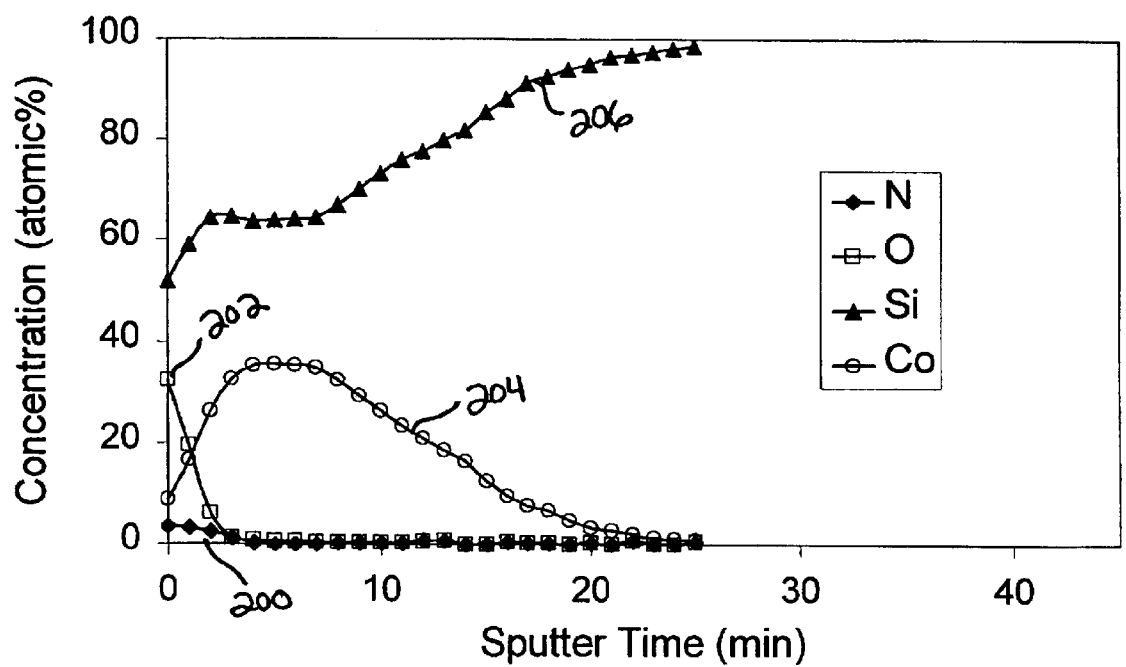
FIG. 2A is the XPS depth profile of an as-received CoSi2 film on Si substrate.

Referring now to FIG. 2A, the XPS depth profile of an as-received CoSi2 film on Si substrate is shown. N 200, O 202, Co 204 and Si 206 signals are shown. Flat distributions of Co 204 and Si 206 signals indicate uniform concentrations across $CoSi_2$ layer. At the top surface of $CoSi_2$ layer, a significant oxygen peak exists in the state of $SiO_2$ (see FIG. 11A).

Figure 2B:
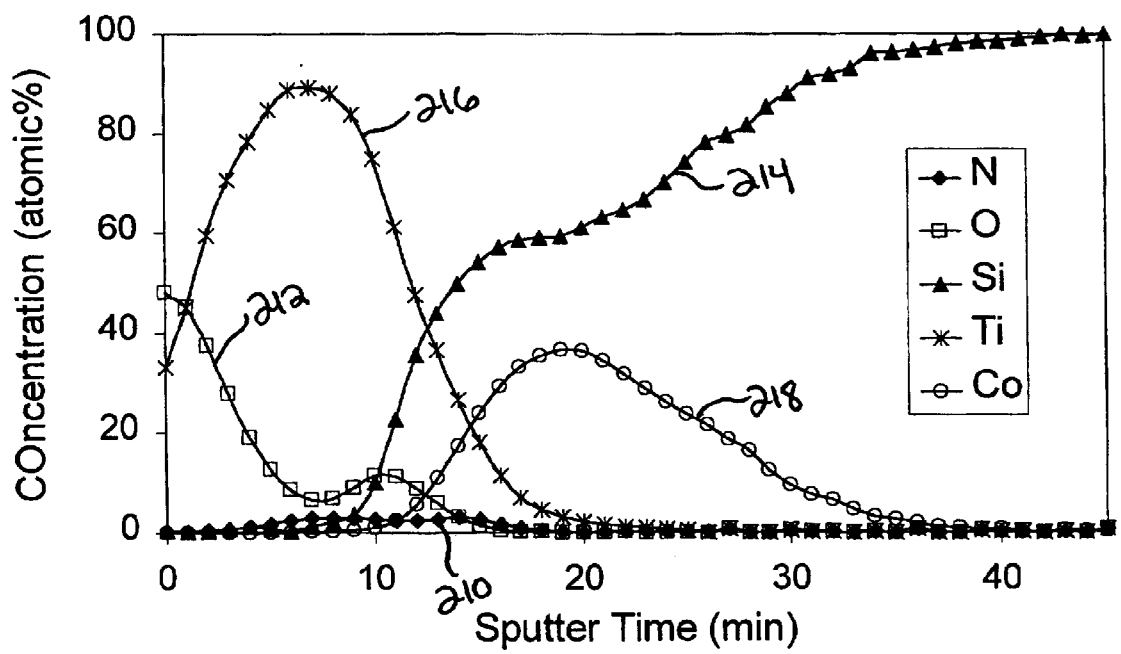
FIG. 2B is the XPS depth profile of the as-deposited wafer with 200 Å IMP Ti on $CoSi_2$.

Now referring to FIG. 2B, the XPS depth profile of the as-deposited wafer with 200 Å IMP Ti on $CoSi_2$ is shown. N 210, O 212, Si 214, Ti 216 and Co 218 signals are shown. The $CoSi_2$ layer is present between the Si substrate and Ti layer. Co 218 and Si 214 distributions are relatively the same as those of the as-received sample. This indicates the Ti-deposition does not affect the stoichiometry of $CoSi_2$ layer. An oxygen pile-up at the $Ti/CoSi_2$ interface is observed. The oxygen is originated from the surface oxide on top of the as-received $CoSi_2$, and it causes high contact resistance.

Figure 3A:
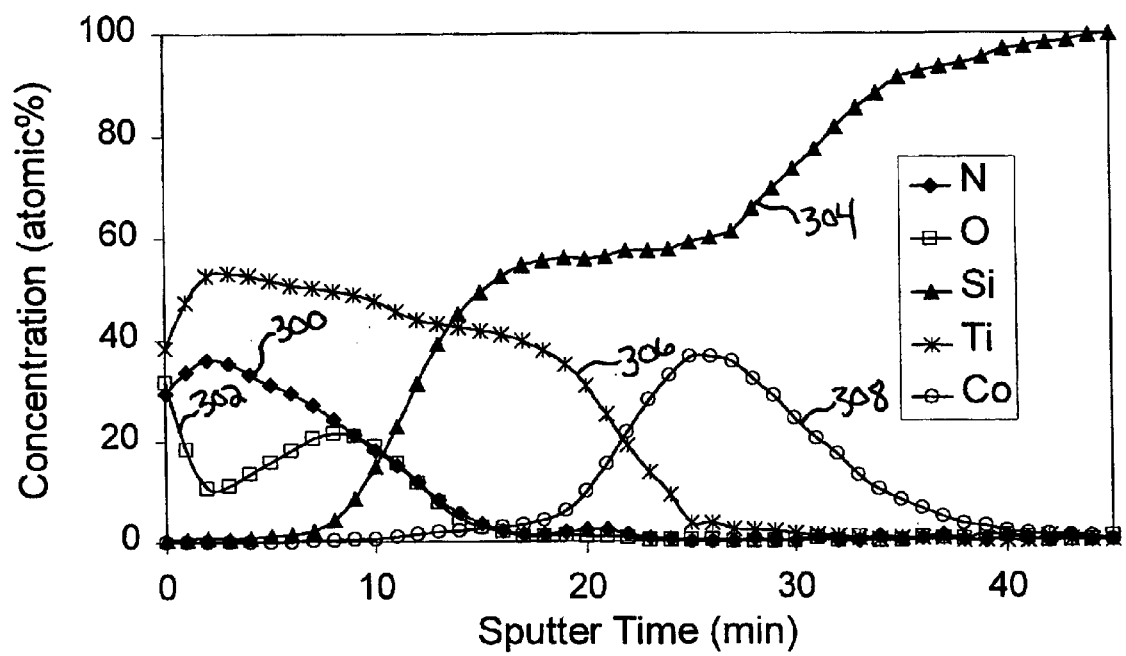
FIG. 3A is the XPS depth profile of the as-deposited wafer after rapid thermal annealing at 725° C. for 30 seconds in accordance with the PRIOR ART.

Referring now to FIG. 3A, the XPS depth profile of the as-deposited wafer after rapid thermal annealing at 725° C. for 30 seconds in accordance with the PRIOR ART is shown. N 300, O 302, Si 304, Ti 306 and Co 308 signals are shown. With RTA at 725° C. for 30 seconds, oxygen pile-up is still present in between the top Ti and $TiSi_2$ layers, and significant amount of nitrogen is incorporated into the top Ti layer due to the RTA ambient. The oxygen pile-up is preserved because, at the RTA temperature of 725° C., Ti quickly diffuses through the interface oxide layer and reacts with $CoSi_2$, while the interface oxygen diffuses slowly within Ti. In addition, Ti reacts with underlying $CoSi_2$ to form $TiSi_2$, in which $CoSi_2$ is broken and resulted in $CoSi_{2-x}$. In this process, Si-poor Co atoms diffuse into the junctions to react with more Si to form $CoSi_2$. This is clearly evident by the XPS depth profile that shows the relatively thick $TiSi_2$ layer in between the top Ti and $CoSi_2$ layers. Excess Si from source/drain junctions is consumed during the above RTA process, in addition to those consumed during the original $CoSi_2$ formation process. As junctions become shallower, this excess Si consumption may be a significant limiting factor for the extendibility of $CoSi_2$.

Figure 3B:
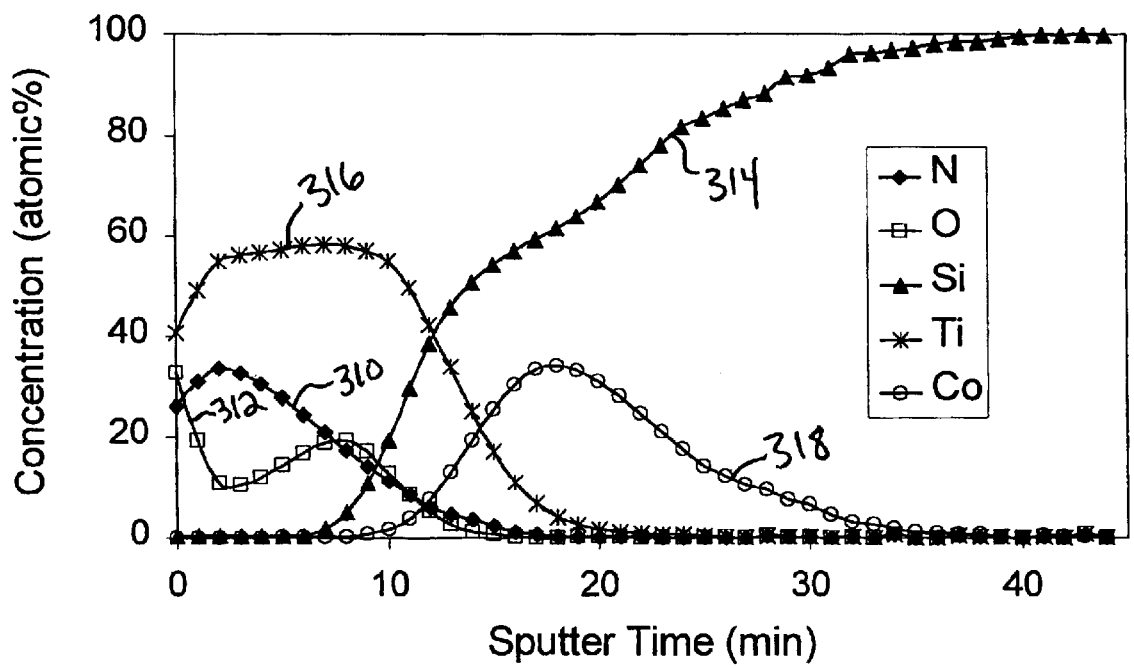
FIG. 3B is the XPS depth profile of the as-deposited wafer after rapid thermal annealing at 615° C. for 30 seconds in accordance with the PRIOR ART.

Now referring to FIG. 3B, the XPS depth profile of the as-deposited wafer after rapid thermal annealing at 615° C. for 30 seconds in accordance with the PRIOR ART is shown. N 310, O 312, Si 314, Ti 316 and Co 318 signals are shown. It is seen that the inter layer consists of Ti 216 and Si 314 is significantly narrowed, with oxygen pile-up becoming slightly flatter.

Figure 4:
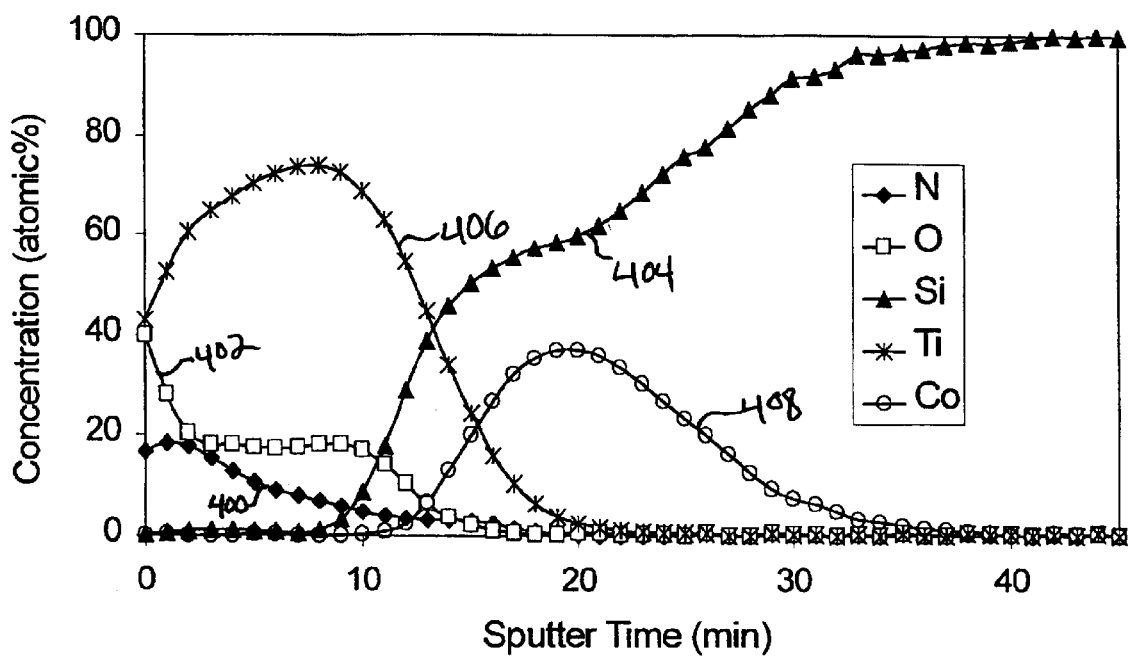
FIG. 4 is the XPS depth profiles of the as-deposited wafer after rapid thermal annealing at 485° C. for 30 seconds in accordance with the present invention.

Referring now to FIG. 4, the XPS depth profiles of the as-deposited wafer after rapid thermal annealing at 485° C. for 30 seconds in accordance with the present invention are shown. N 400, O 402, Si 404, Ti 406 and Co 408 signals are shown. By annealing the $Ti\text{—}CoSi_2$ interfacial system at temperature around 485° C., Ti reacts with interface oxygen and the oxygen evenly diffuses through the Ti layer. The high resistivity layer at the interface is eliminated. The RTA temperature of 485° C. is low enough to prevent from the formation of $TiSi_2$, therefore the integrity of the $CoSi_2$ layer is maintained and no excess Si consumption takes place during this RTA process.

Figure 5:
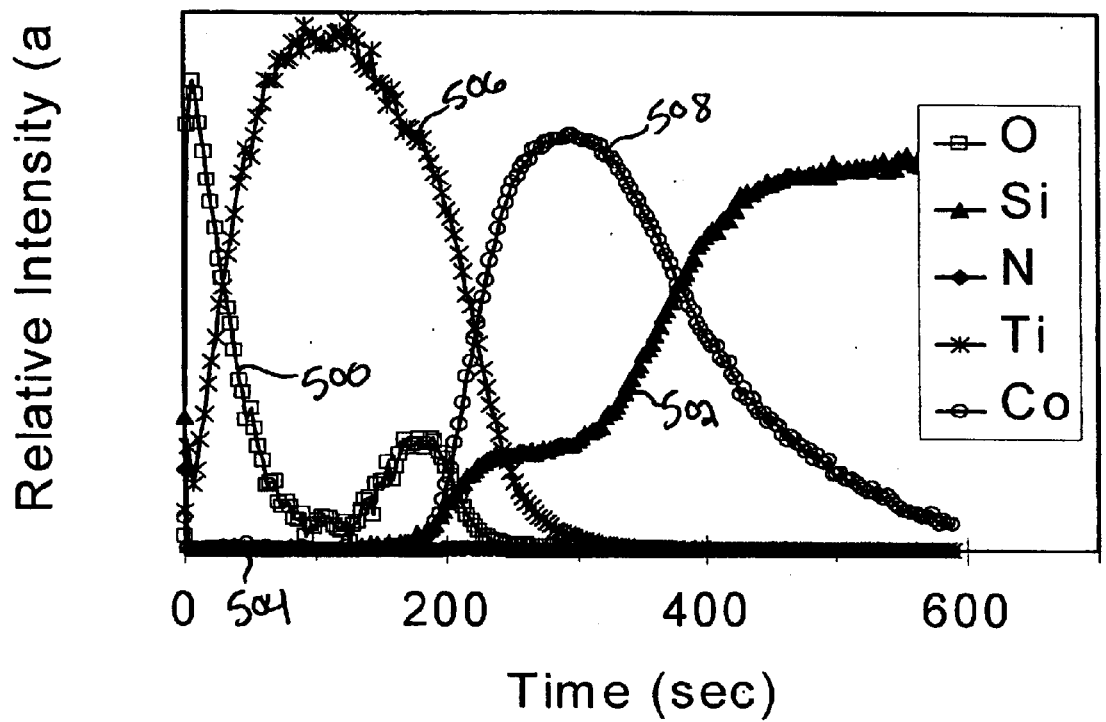
FIG. 5 shows the TOP-SIMS depth profiles of the as-deposited with 200 Å IMP Ti on $CoSi_2$.

TOF-SIMS depth profiles with high depth resolution confirm the results of XPS depth profiles. The TOP-SIMS depth profiles of the as-deposited with 200 Å IMP Ti on $CoSi_2$ are shown in FIG. 5. O 500, Si 502, N 504, Ti 506 and Co 508 signals are shown.

Figure 6A:
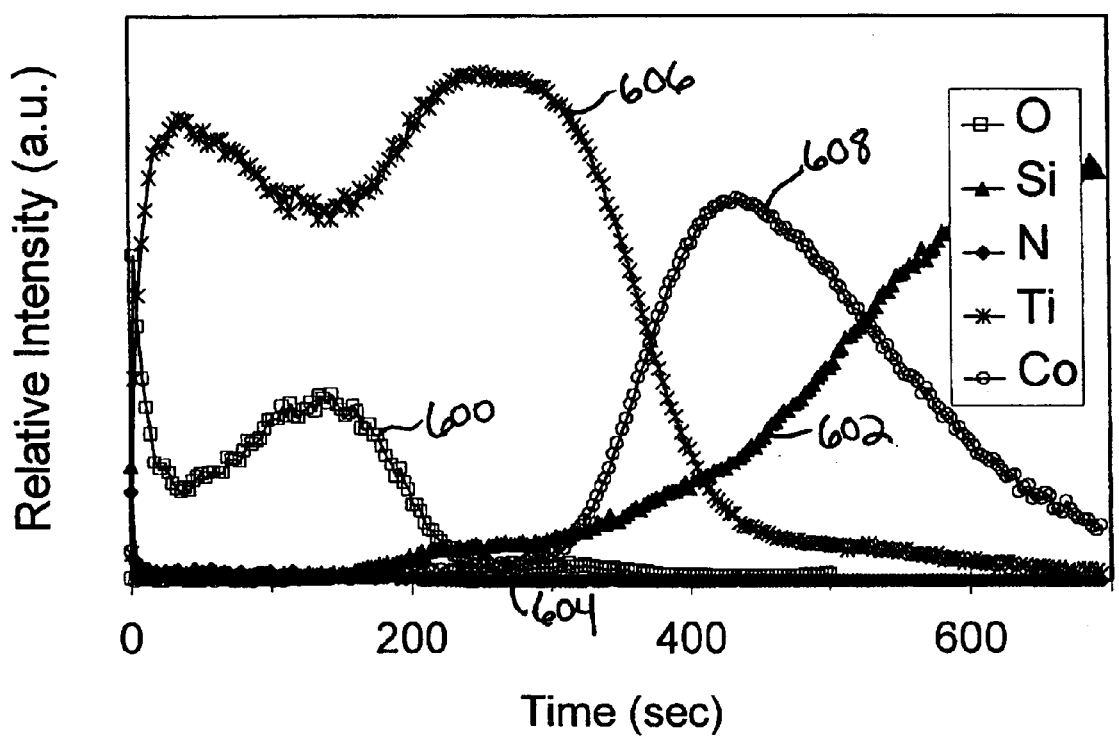
FIG. 6A shows the TOP-SIMS depth profiles of the as-deposited 200 Å IMP Ti—$CoSi_2$ wafer after rapid thermal annealing at 725° C. in accordance with the PRIOR ART.
Figure 6B:
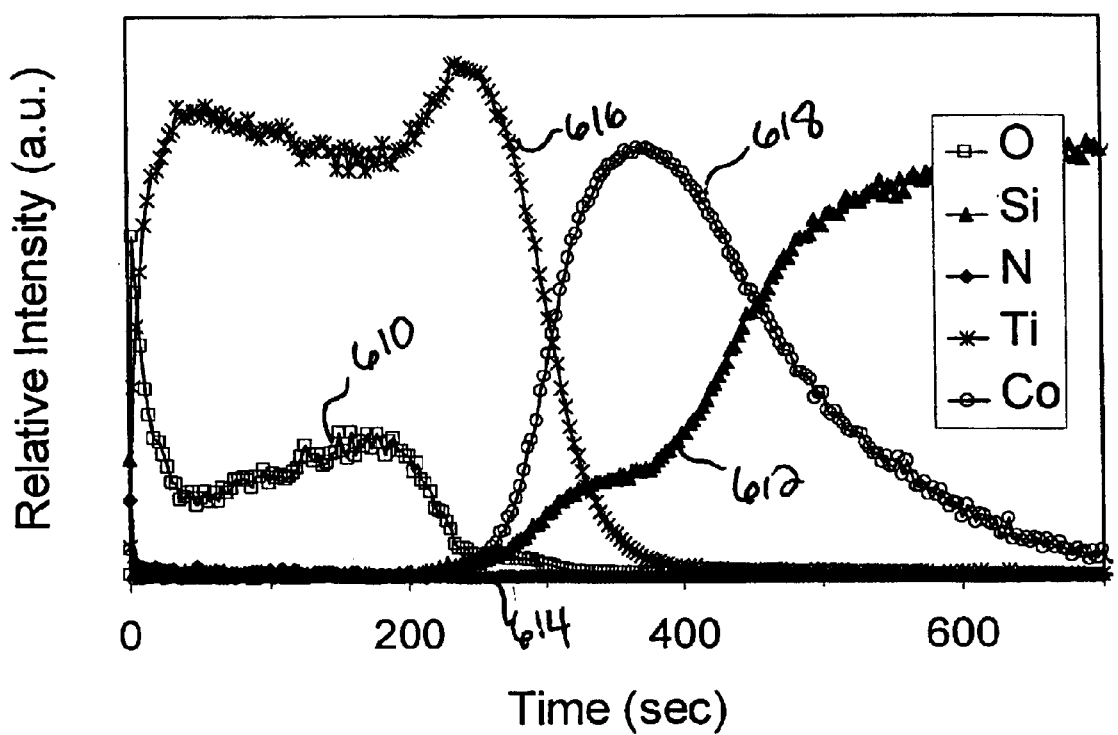
FIG. 6B shows the TOP-SIMS depth profiles of the as-deposited 200 Å IMP Ti—$CoSi_2$ wafer after rapid thermal annealing at 615° C. in accordance with the PRIOR ART.

The TOP-SIMS depth profiles of the as-deposited 200 Å IMP $Ti\text{—}CoSi_2$ wafer after rapid thermal annealing at 725° C. in accordance with the PRIOR ART are shown in FIG. 6A. O 600, Si 602, N 604, Ti 606 and Co 608 signals are shown. The TOP-SIMS depth profiles of the as-deposited 200 Å IMP $Ti\text{—}CoSi_2$ wafer after rapid thermal annealing at 615° C. in accordance with the PRIOR ART are shown in FIG. 6B. O 610, Si 612, N 614, Ti 616 and Co 618 signals are shown.

Figure 7:
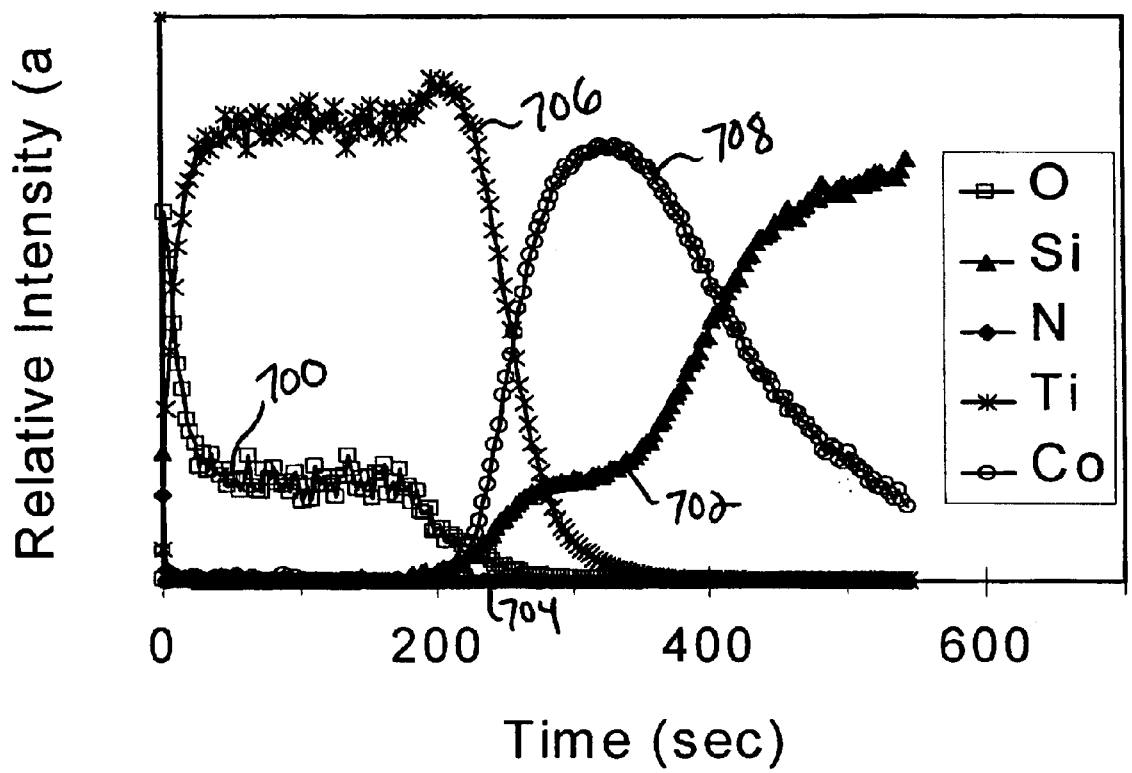
FIG. 7 shows the TOP-SIMS depth profiles of the as-deposited 200 Å IMP Ti—$CoSi_2$ wafer, and the wafers after rapid thermal annealing at 485° C. in accordance with the present invention.

The TOP-SIMS depth profiles of the as-deposited 200 Å IMP $Ti\text{—}CoSi_2$ wafer, and the wafers after rapid thermal annealing at 485° C. in accordance with the present invention are shown in FIG. 7. O 700, Si 702, N 704, Ti 706 and Co 708 signals are shown.

In addition, TOF-SIMS depth profiling indicates that Ti diffuses deeply through the entire $CoSi_2$ layer to Si substrate after RTA at 725° C. (FIG. 6A). Meanwhile, Si signal intensity increases along the depth profiling through the $CoSi_2$ layer, which indicates a degradation of $CoSi_2$ integrity. For the wafer after 485° C. RTA, Ti signal intensity reaches the detection limit of TOF-SIMS shortly after reaching into $CoSi_2$ layer, and a flat distribution of Si signal through $CoSi_2$ layer indicates the integrity of $CoSi_2$ is preserved (comparing with FIGS. 5, 6A, 6B and 7). N signal variation is not clearly detected in all TOF-SIMS depth profiles due to the very low secondary ion yield of $CsN^+$.

Figure 8:
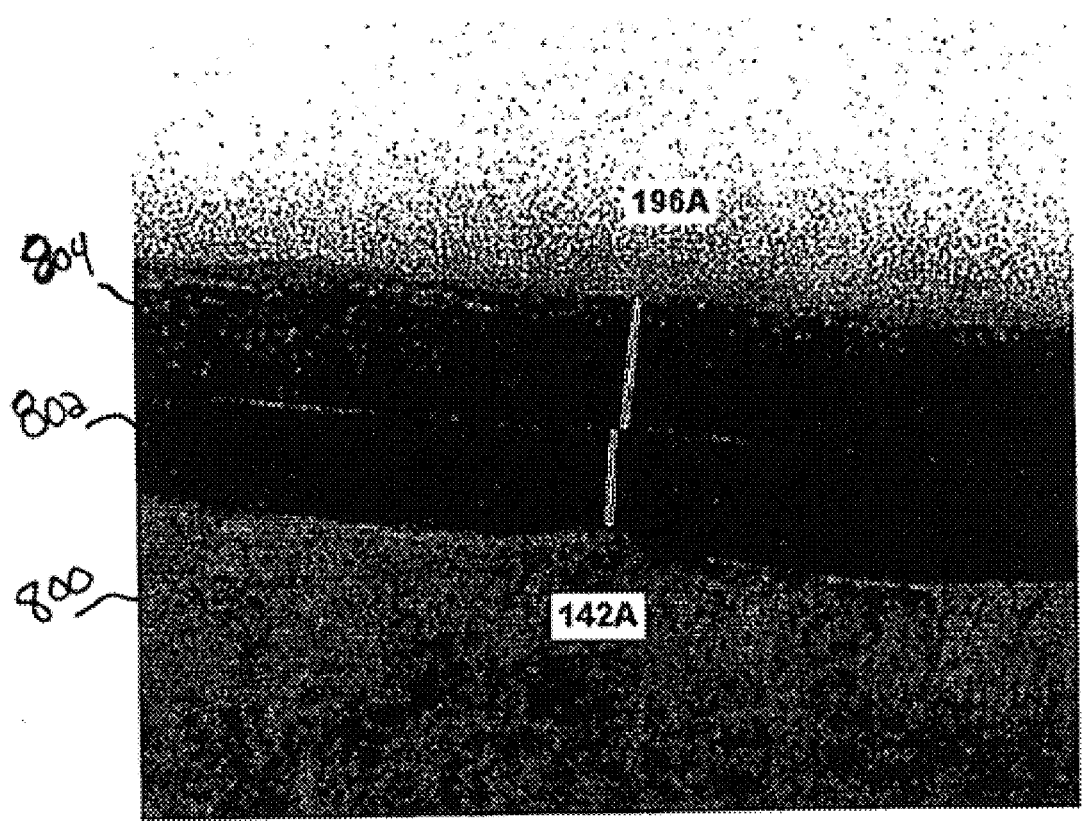
FIG. 8 shows the TEM cross-section images of the as-deposited 200 Å IMP Ti—$CoSi_2$ wafer.

Now referring to FIG. 8, the TEM cross-section images of the as-deposited 200 Å IMP $Ti\text{—}CoSi_2$ wafer are shown.

After the 200 Å IMP Ti deposition, two separate layers of Ti 804 and $CoSi_2$ 802 are shown above the substrate 800. The Ti layer 804 measured ~196 Å and the $CoSi_2$ layer 802 measured ~142 Å. An interfacial oxide layer can be clearly seen in the TEM cross-section image.

Figure 9A:
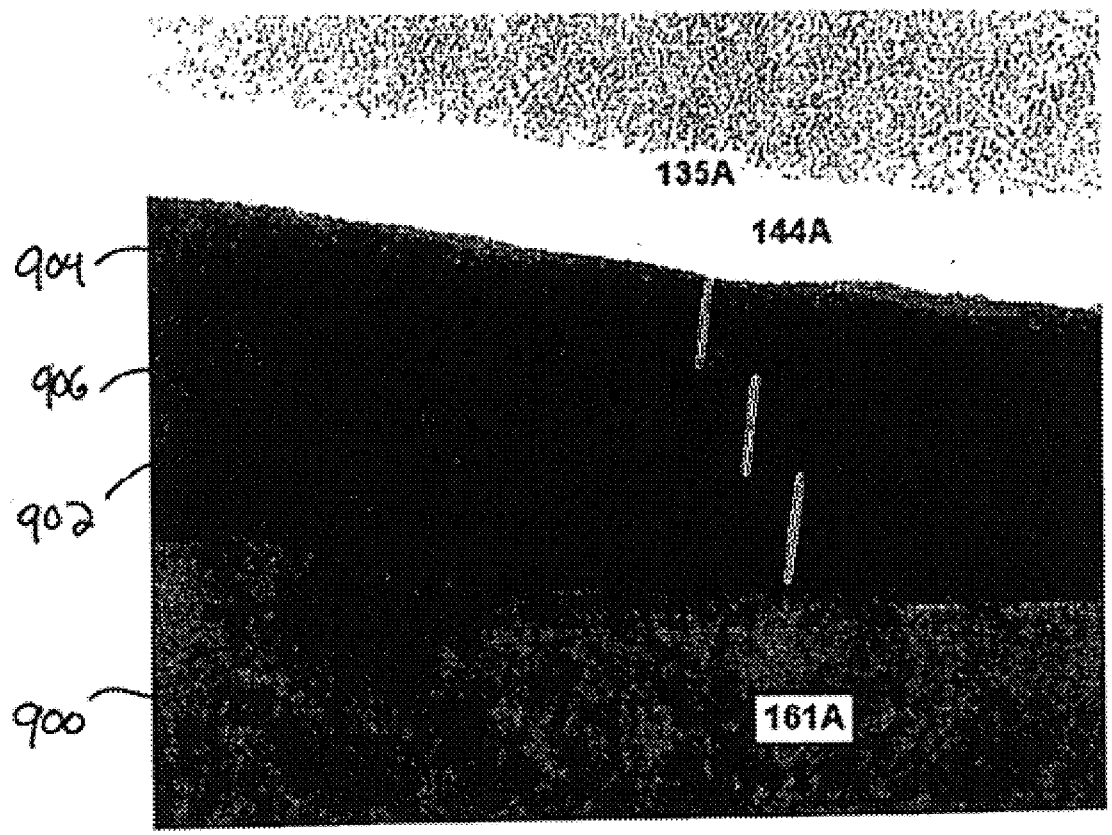
FIG. 9A shows the TEM cross-section images of the as-deposited 200 Å IMP Ti—CoSi$_2$ wafer after rapid thermal annealing at 725° C. in accordance with the PRIOR ART.

Referring now to FIG. 9A, the TEM cross-section images of the as-deposited 200 Å IMP Ti—$CoSi_2$ wafer after rapid thermal annealing at 725° C. n accordance with the PRIOR ART are shown. The three layers, $CoSi_2$ layer 902, Ti layer 904 and $TiSi_2$ interlayer 906, are clearly present above the substrate 900. The top Ti layer 904 thickness is reduced to ~135 Å and the $TiSi_2$ interlayer 906 is measured ~144 Å. In addition, the thickness of the $CoSi_2$ layer 902 increases to ~161 Å as well.

Figure 9B:
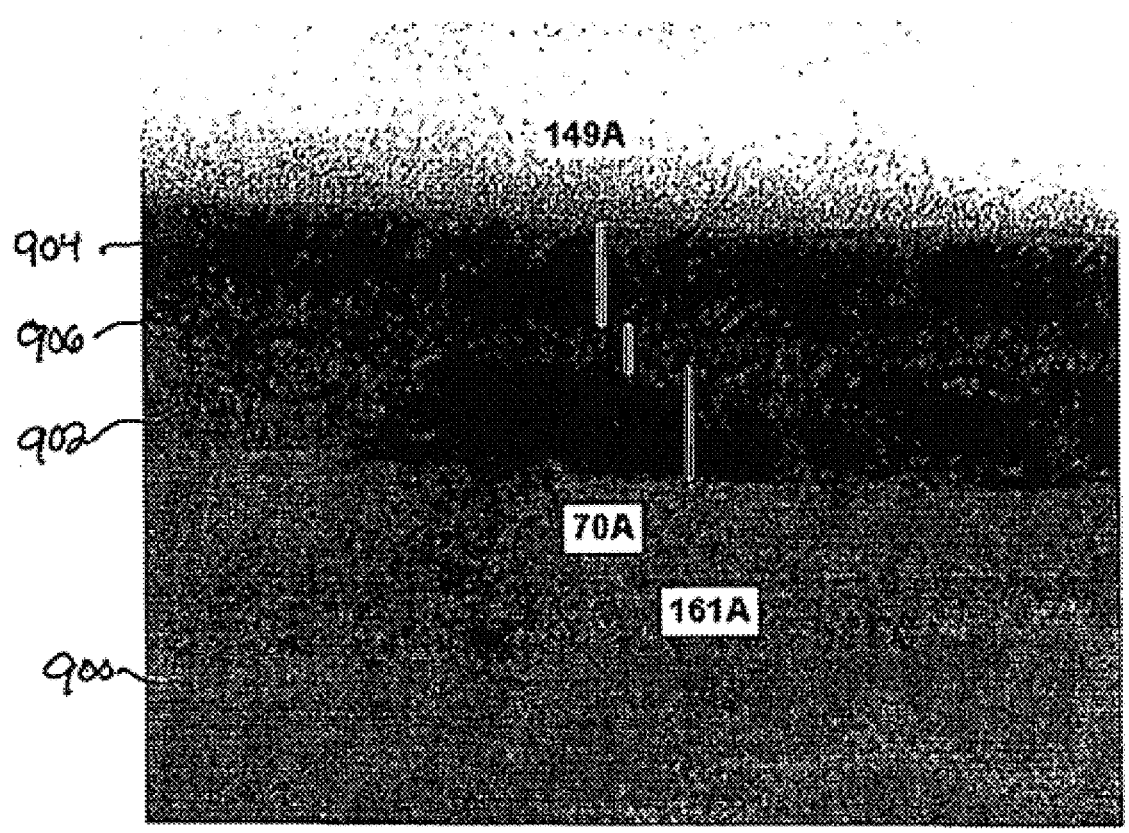
FIG. 9B shows the TEM cross-section images of the as-deposited 200 Å IMP Ti—CoSi$_2$ wafer after rapid thermal annealing at 615° C. in accordance with the PRIOR ART.

Now referring to FIG. 9B, the TEM cross-section images of the as-deposited 200 Å IMP Ti—$CoSi_2$ wafer after rapid thermal annealing at 615° C. in accordance with the PRIOR ART are shown. Three layers are again present, but with a much thinner interlayer than that of FIG. 9A. The thickness of the top Ti layer 904, the $TiSi_2$ interlayer 906 and the $CoSi_2$ layer 902 are measured ~149, ~70 and ~161 Å, respectively.

Figure 10:
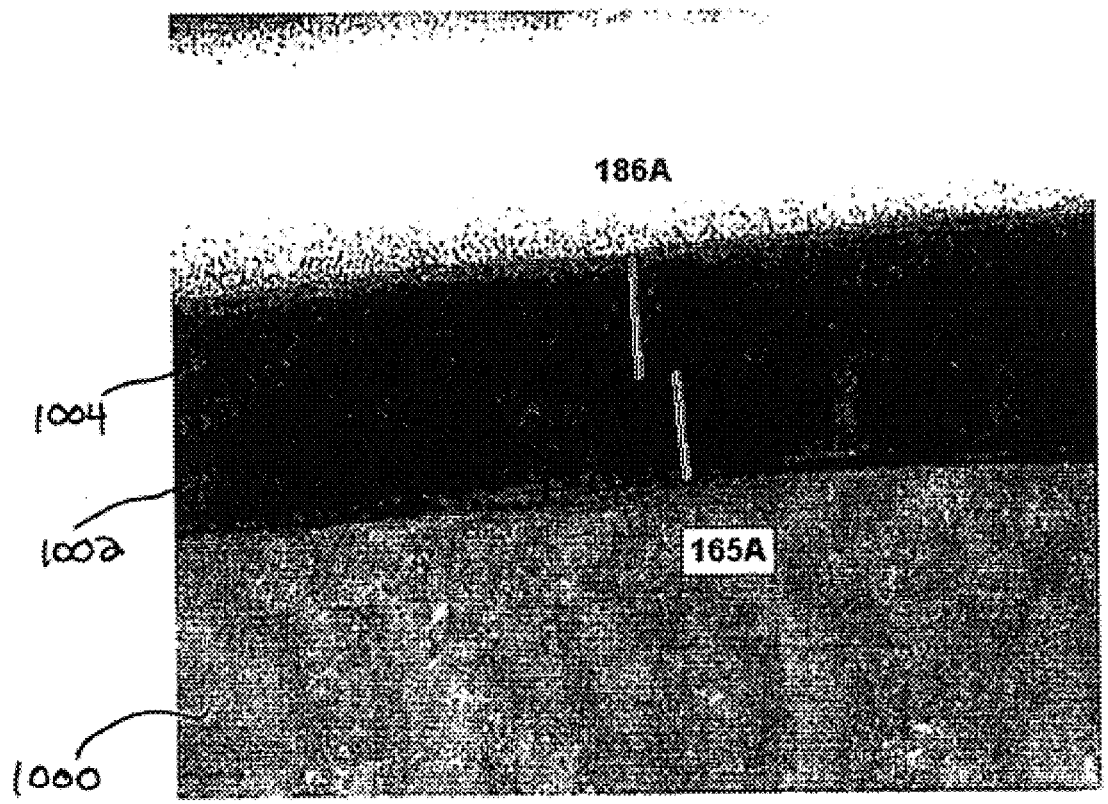
FIG. 10 shows the TEM cross-section images of the as-deposited 200 Å IMP Ti—CoSi$_2$ wafer after rapid thermal annealing at 485° C. in accordance with the present invention.

Referring now to FIG. 10, the TEM cross-section images of the as-deposited 200 Å IMP Ti—$CoSi_2$ wafer after rapid thermal annealing at 485° C. in accordance with the present invention are shown. It is seen that the two layers of Ti 1004 and $CoSi_2$ 1002 are very well preserved above substrate 1000. Assuming both $TiSi_2$ interlayer and $CoSi_2$ layer 1002 are stoiciometric, and utilizing Si consumption data of 1.04 for $CoSi_2$ and 0.9 for $TiSi_2$ for calculation, the Si consumptions of the wafers after RTA at 725, 615 and 485° C. are 297, 230, and 172 Å, respectively. This result is in good agreement with the XPS and TOF-SIMS depth profiling analyses that excess Si consumption takes place when the IMP Ti—$CoSi_2$ system is processed at a RTA temperature higher than 615° C. There exists an optimal RTA temperature process window where the interfacial oxide is reduced to improve contact resistance. Meanwhile, the RTA temperature is low enough so that no $TiSi_2$ is formed and $CoSi_2$ integrity is preserved. In this way, no excess Si is consumed. Results from the wafer after RTA at 485° C. is an example of processing with the optimal RTA process window.

Figure 11A:
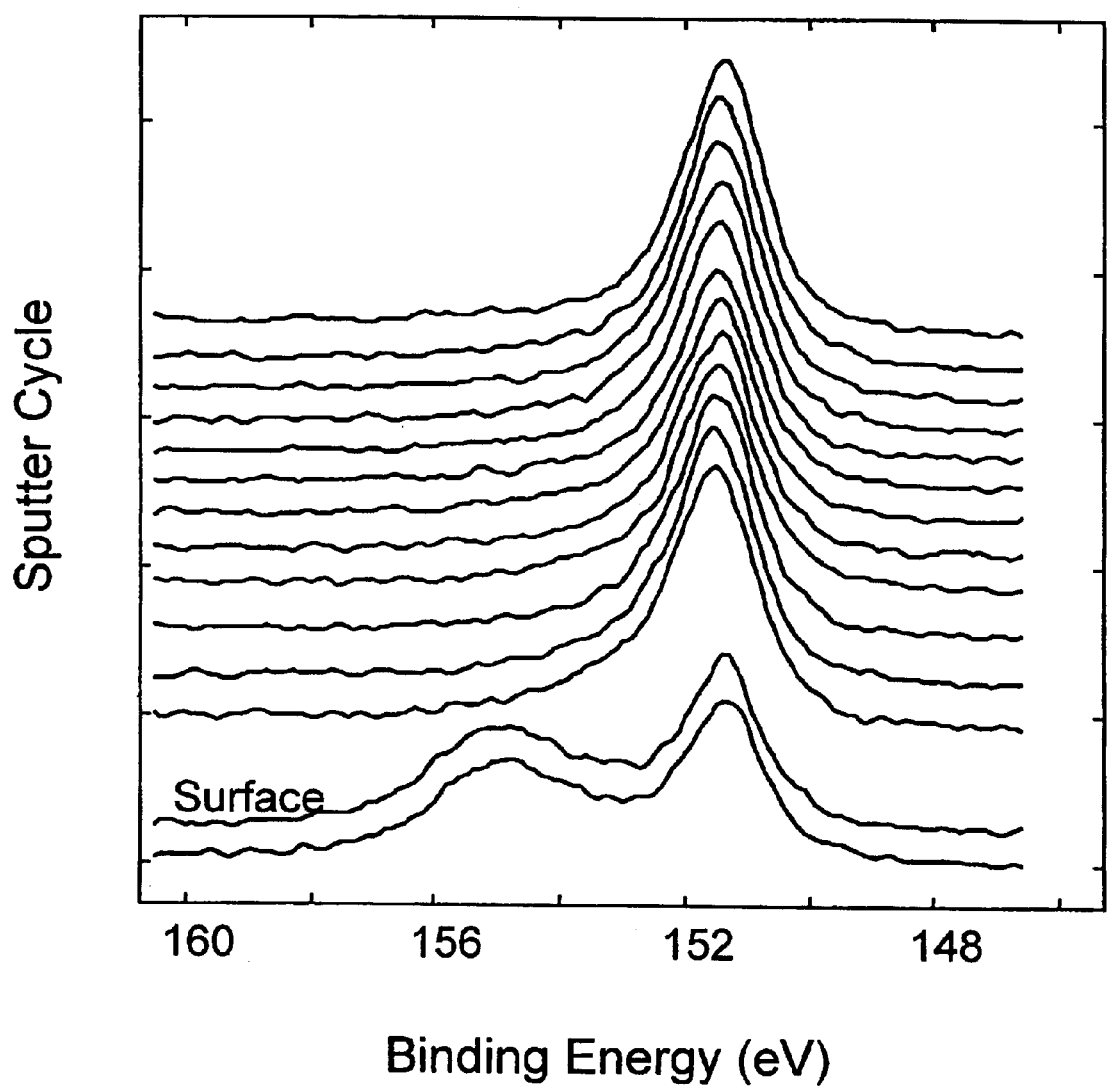
FIG. 11A shows high resolution XPS spectra of Si $2s$ region of the as-received CoSi$_2$ wafer along with the ion sputtering cycle.
Figure 11B:
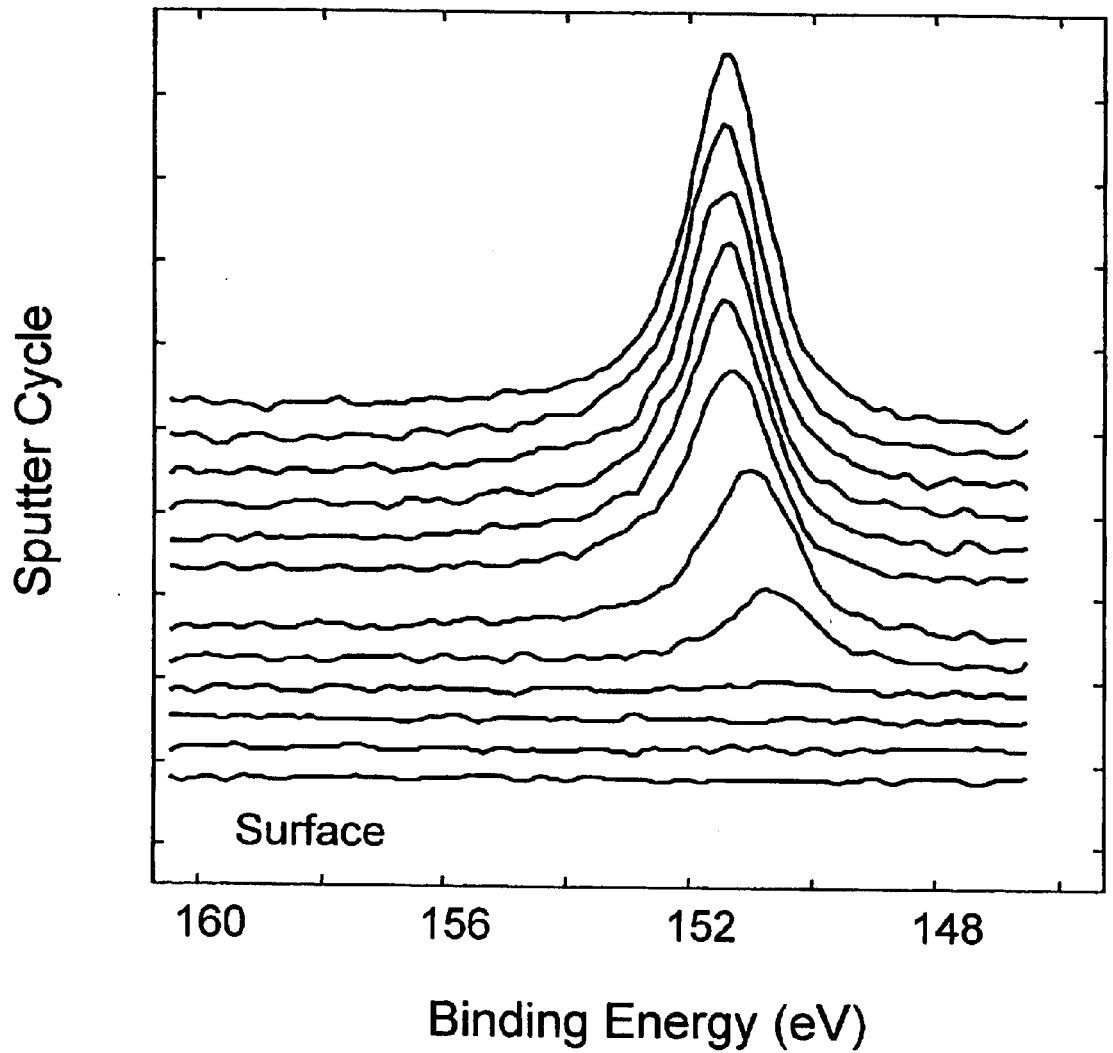
FIG. 11B shows high resolution XPS spectra of Si $2s$ region of the as-depositied 200 Å IMP Ti—CoSi$_2$ wafer along with the ion sputtering cycle.

The interface reaction of Ti—$CoSi_2$ system with different RTA temperatures is further supported by the chemical state information obtained from the high-resolution XPS core spectra. The high resolution XPS spectra of Si 2s region of the as-received $CoSi_2$ wafer, the as-deposited 200 Å IMP Ti—$CoSi_2$ wafer, and the wafers after RTA at 725 and 485° C., along with the ion sputtering cycle, are shown in FIGS. 11A, 11B, 12 and 13. FIG. 11A shows high resolution XPS spectra of Si 2s region of the as-received $CoSi_2$ wafer along with the ion sputtering cycle and FIG. 11B shows high resolution XPS spectra of Si 2s region of the as-depositied 200 Å IMP Ti—$CoSi_2$ wafer along with the ion sputtering cycle. Si 2s was chosen to calculate the elemental composition and to represent the chemical state information, because Si 2p and Co 3s peaks partially overlap to each other. At the top surface of the as-received $CoSi_2$ wafer, the Si 2s peak has two resolved peaks corresponding to the Si chemical states in Co disilicide (151.5 eV) and $SiO_2$ (154.9 eV) (FIG. 11A). The surface oxide thickness is estimated to be about 30–40 A from XPS peak ratio analysis. This is in agreement with XPS and TOF-SIMS depth profiling results that a thin $SiO_2$ layer is present at the top surface of the as-received $CoSi_2$. After IMP Ti deposition without RTA (FIG. 11B), only one peak is present at the Ti—$CoSi_2$ interface with a binding energy of 150.7 eV. Sputtering into the $CoSi_2$ layer, Si 2s peak shifts to 151.5 eV, corresponding to $CoSi_2$. This suggests that IMP Ti deposition process dissociates $SiO_2$ into free oxygen and metallic Si (or TiSix), though oxygen is still piled up at the Ti—$CoSi_2$ interface.

Figure 12:
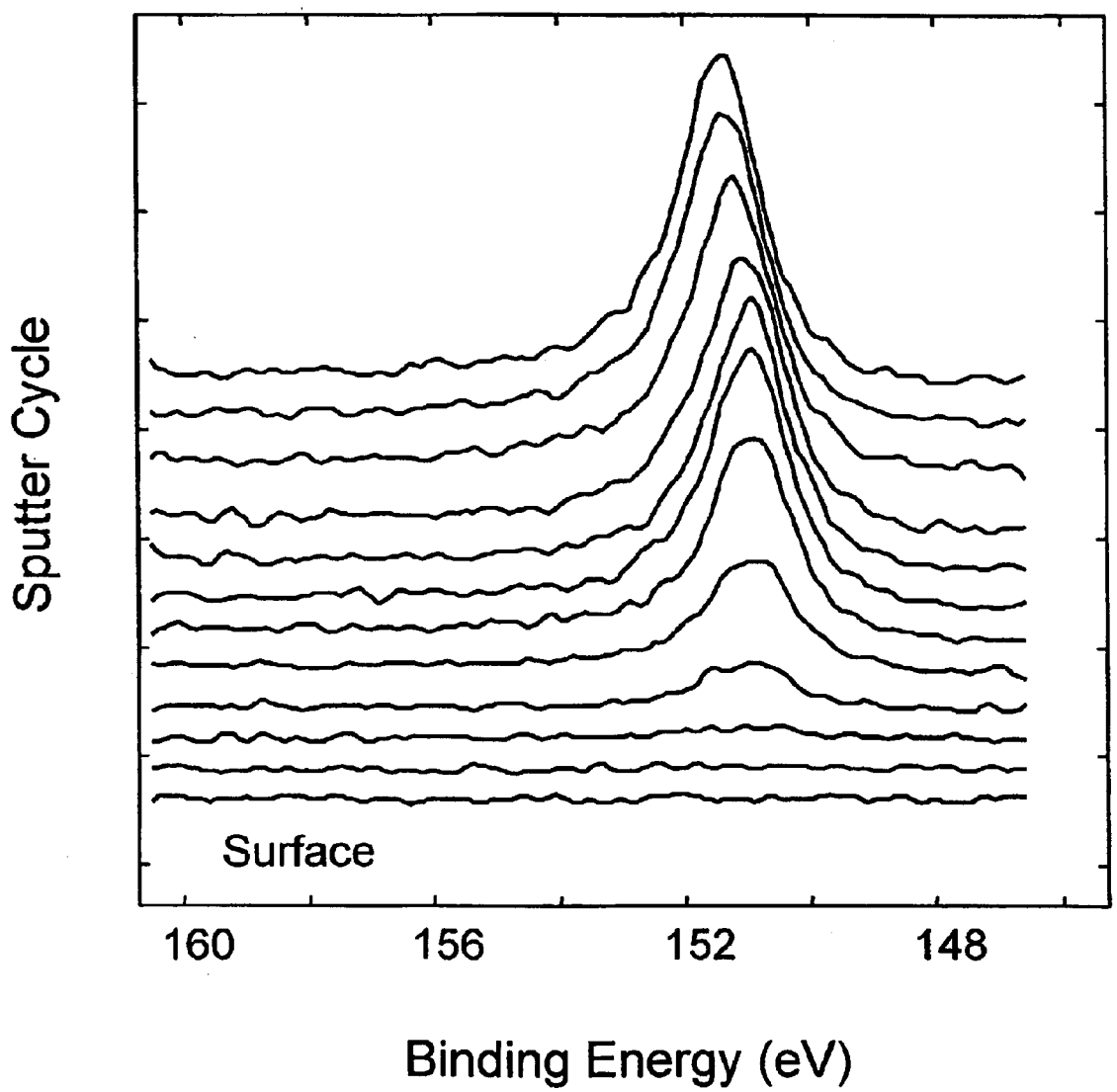
FIG. 12 shows high resolution XPS spectra of Si $2s$ region of the as-depositied 200 Å IMP Ti—CoSi$_2$ wafer after rapid thermal annealing at 725° C. in accordance with the PRIOR ART.

Now referring to FIG. 12, high-resolution XPS spectra of Si 2s region of the as-depositied 200 Å IMP Ti—$CoSi_2$ wafer after rapid thermal annealing at 725° C. in accordance with the PRIOR ART is shown. It is clearly seen that Si 2s peak has a binding energy of 150.7 eV within the sputtering time window of 10–20 minutes (according to FIG. 3A), which corresponding to the chemical state of $TiSi_2$. After 20 minutes sputtering, Si 2s binding energy shifts up to 151.5 eV, which corresponds to the chemical state of $CoSi_2$.

Figure 13:
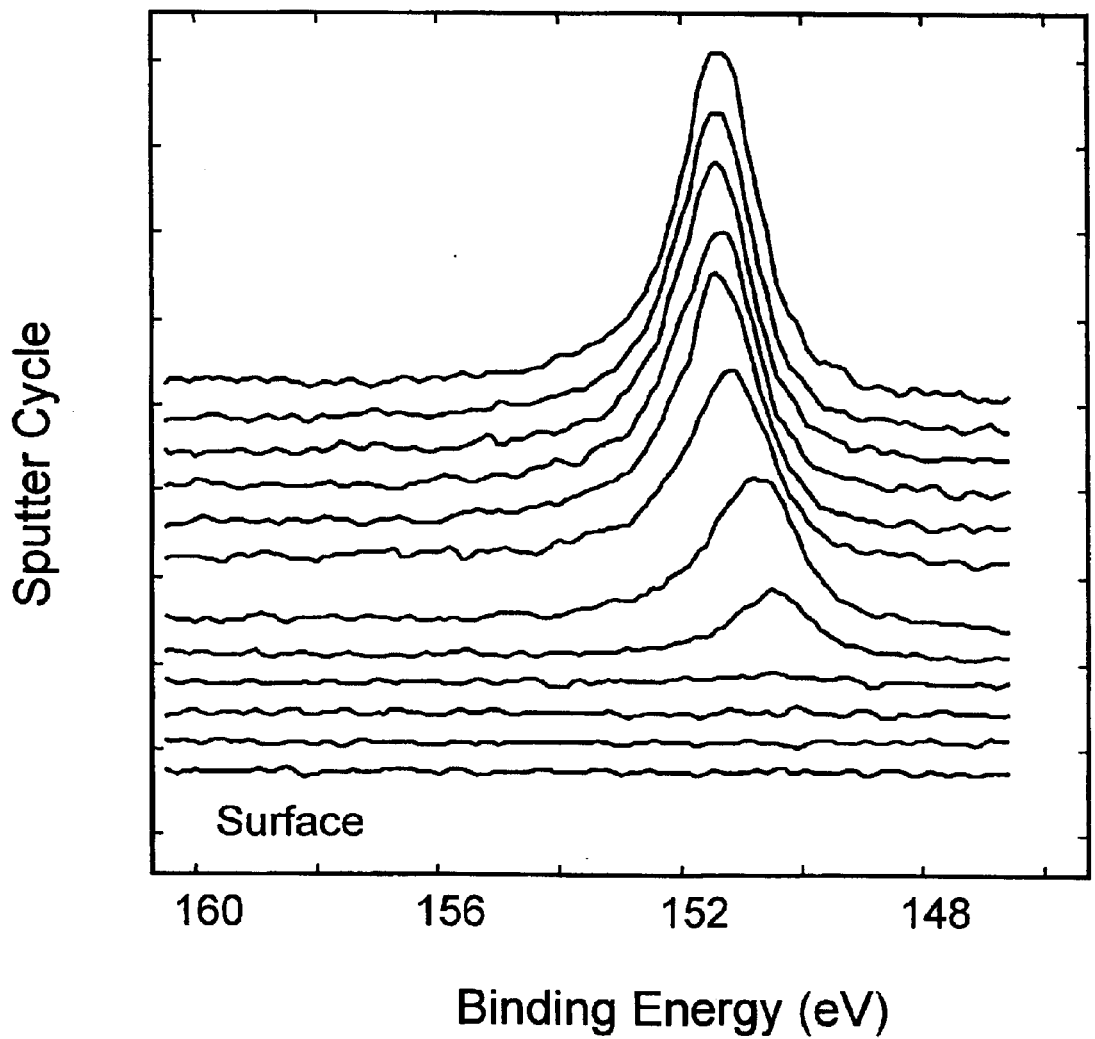
FIG. 13 shows high resolution XPS spectra of Si $2s$ region of the as-depositied 200 Å IMP Ti—CoSi$_2$ wafer after rapid thermal annealing at 485° C. along with the ion sputtering cycle in accordance with the present invention.

Referring now to FIG. 13, high resolution XPS spectra of Si 2s region of the as-depositied 200 Å IMP Ti—$CoSi_2$ wafer after rapid thermal annealing at 485° C. along with the ion sputtering cycle in accordance with the present invention is shown. Similar to that of FIG. 11B, only one peak is present at the Ti—$CoSi_2$ interface with a binding energy of 150.7 eV and no $SiO_2$ is present. Sputtering into the $CoSi_2$ layer, Si 2s peak shifts to 151.5 eV, corresponding to $CoSi_2$. This indicates that no significant amount of $TiSi_2$ is formed from Ti—$CoSi_2$ system with 485° C. RTA.

Figure 14:
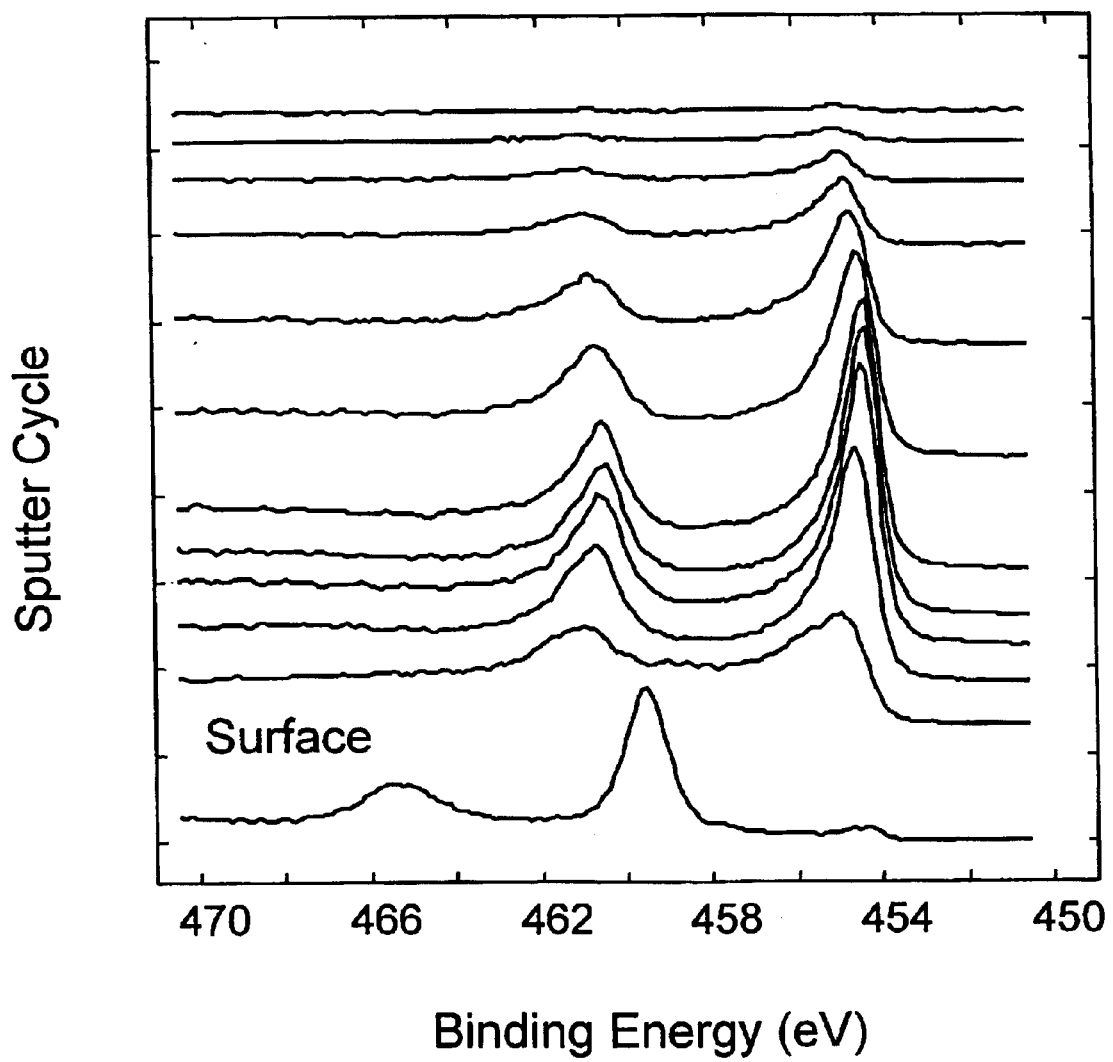
FIG. 14 shows the high resolution XPS spectra of Ti $2p$ region of the as-deposited 200 Å IMP Ti—CoSi$_2$ wafer.

FIG. 14 shows the high-resolution XPS spectra of Ti 2p region of the as-deposited 200 Å IMP Ti—$CoSi_2$ wafer.

Figure 15:
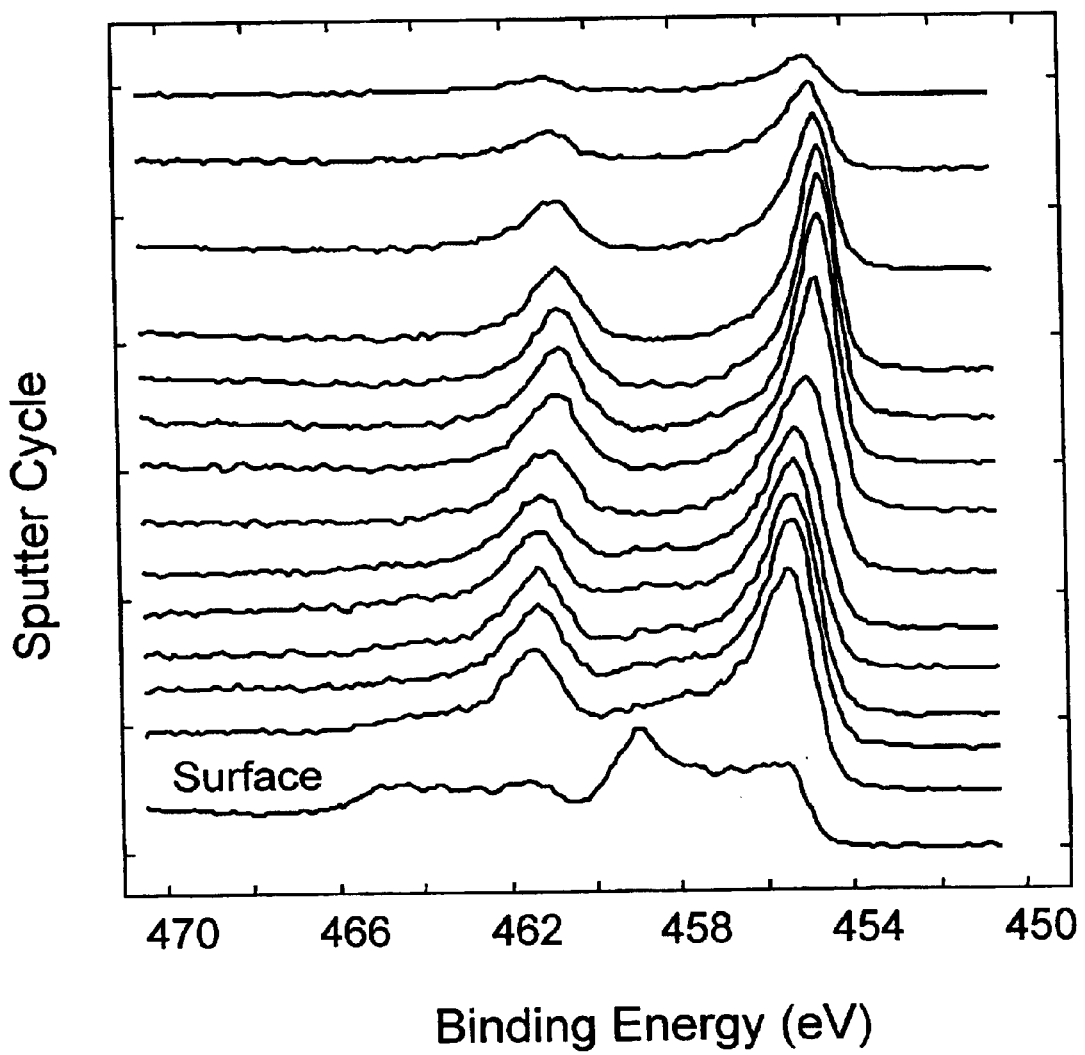
FIG. 15 shows the high resolution XPS spectra of Ti $2p$ region of the as-deposited 200 Å IMP Ti—CoSi$_2$ wafer after rapid thermal annealing at 725° C. along with ion sputtering in accordance with the PRIOR ART.

FIG. 15 shows the high-resolution XPS spectra of Ti 2p region of the as-deposited 200 Å IMP Ti—$CoSi_2$ wafer after rapid thermal annealing at 725° C. along with ion sputtering in accordance with the PRIOR ART.

Figure 16:
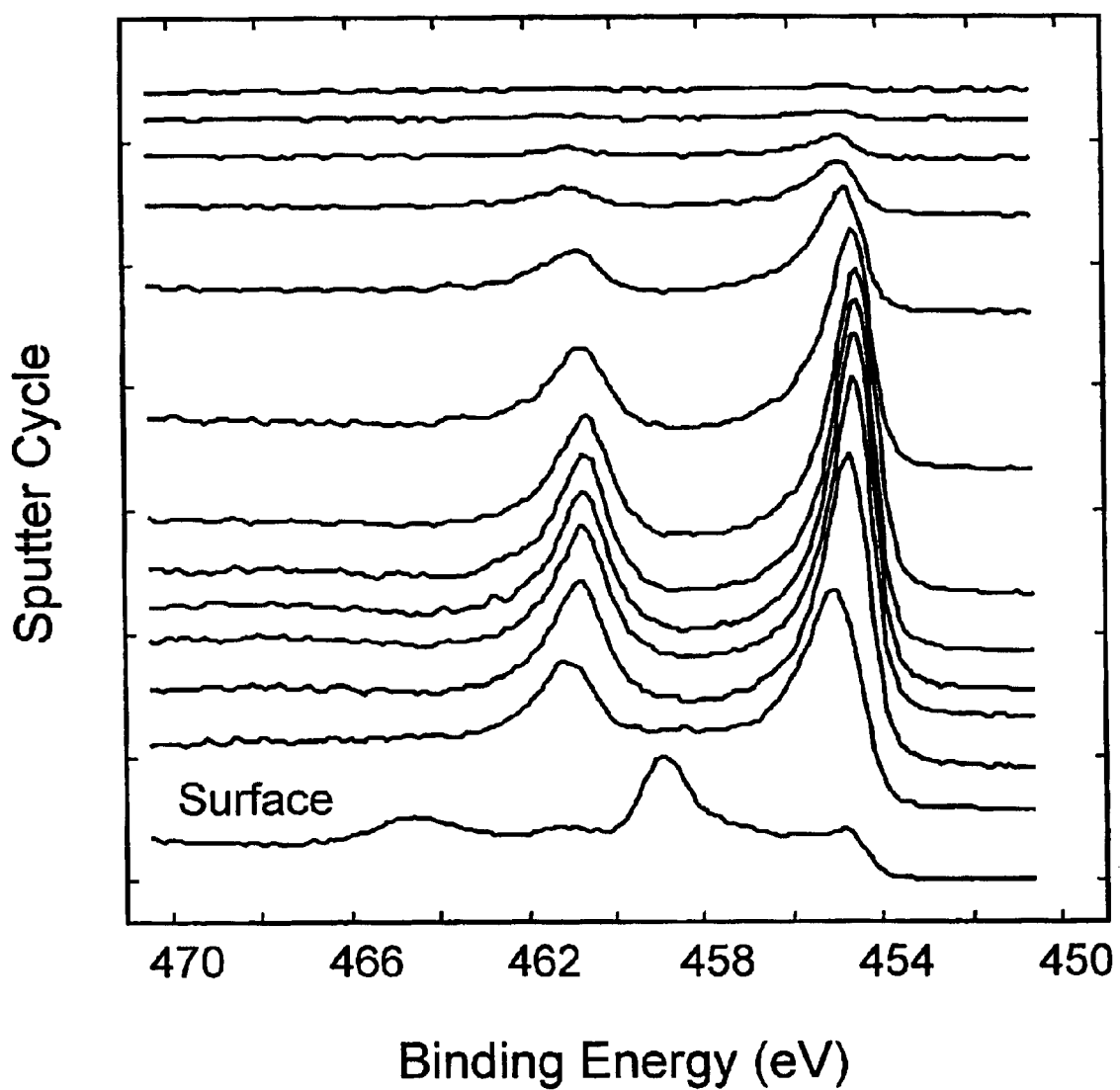
FIG. 16 shows the high resolution XPS spectra of Ti $2p$ region of the as-deposited 200 Å IMP Ti—CoSi$_2$ wafer after rapid thermal annealing at 485° C. along with ion sputtering in accordance with the present invention.

FIG. 16 shows the high resolution XPS spectra of Ti 2p region of the as-deposited 200 Å IMP Ti—$CoSi_2$ wafer after rapid thermal annealing at 485° C. along with ion sputtering in accordance with the present invention. The binding energy of the as-deposited IMP Ti $2p_{3/2}$ is 454.4 eV, corresponding to metallic Ti. After the RTA at 725° C., two trends of Ti 2p peaks are present. From the wafer surface to about 10 minutes sputtering, Ti $2p_{3/2}$ has a binding energy of 455.3 eV, corresponding to the chemical states of TiN/TiO.

This is confirmed by FIG. 3A, which shows that significant amounts of oxygen and nitrogen are present in the top Ti layer. Within the sputtering time window of 10–20 minutes, Ti $2p_{3/2}$ binding energy shifts down to 454.6 eV, which corresponds to the chemical state of $TiSi_2$. Similar to FIG. 14, FIG. 16 shows no significant peak shift of Ti $2p_{3/2}$ after the Ti—$CoSi_2$ wafer is rapid thermally annealed at 485° C. The Ti $2p_{3/2}$ binding energy of this bulk sample is 454.6 eV. Considering no silicide formation is observed from this sample (FIGS. 4 and 7), it can be concluded that Ti in Ti—$CoSi_2$ system after the 485° C. RTA exits as $TiO_{1-x}$.

The foregoing illustrates the impact of Ti deposition and its subsequent thermal treatment using XPS, TOF-SIMS and TEM. $CoSi_2$ surface is covered with a native oxide upon exposure to air. This oxide layer may be reduced by depositing a Ti layer, followed by RTA. However, if the temperature is too high (greater than or equal to 615° C.), Ti atoms can destroy the integrity of the original $CoSi_2$ layer by taking Si from Co to form $TiSi_2$. The Si-poor Co atoms then diffuse to the junction to react with more Si to form $CoSi_2$. In this process, more Si is consumed in addition to those consumed in the original silicidation process. When the Ti—$CoSi_2$ interfacial system is processed in an optimal RTA temperature window, the interfacial oxide is reduced to form low resistance contacts, while the RTA temperature is low enough to preserve the integrity of the original $CoSi_2$ layer. Therefore, the excess Si consumption is prevented.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A method for preventing excess silicon consumption in a semiconductor wafer, comprising the steps of:

depositing a metal layer on top of a native oxide layer that resides upon a silicide layer; and reducing the native oxide layer to form low resistance contacts, using a rapid thermal annealing process within a temperature range greater than 350° C. and less than 615° C.

2. The method as recited in claim 1, wherein the temperature range is about 485° C. to 550° C.

3. The method as recited in claim 1, wherein the temperature range is approximately 485° C.

4. The method as recited in claim 1, wherein excess silicon consumption is substantially reduced.

5. The method as recited in claim 1, wherein excess silicon consumption is reduced to approximately zero.

6. The method as recited in claim 1, wherein the metal layer comprises a metal selected from the group consisting of Ti, Co, W, Ni and Pt.

7. The method as recited in claim 1, wherein the metal layer is Ti.

8. The method as recited in claim 1, wherein the silicide layer is $CoSi_2$.

9. A method for preventing excess silicon consumption in a semiconductor wafer, comprising the steps of:

depositing a metal layer on top of a native oxide layer that resides upon a $CoSi_2$ layer; and reducing the native oxide layer to form low resistance contacts, using a rapid thermal annealing process at a temperature greater than 350° C. and less than 615° C.

10. The method as recited in claim 9, wherein the temperature is about 485° C. to 550° C.

11. The method as recited in claim 9, wherein the temperature is approximately 485° C.

12. The method as recited in claim 9, wherein excess silicon consumption is substantially reduced.

13. The method as recited in claim 9, wherein excess silicon consumption is reduced to approximately zero.

14. The method as recited in claim 9, wherein the metal layer comprises a metal selected from the group consisting of Ti, Co, W, Ni and Pt.

15. The method as recited in claim 9, wherein the metal layer is Ti.

16. A system for preventing excess silicon consumption in a semiconductor wafer, comprising:

deposition of a metal layer atop a native oxide layer that resides upon a $CoSi_2$ layer, wherein the metal layer comprises a metal selected from the group consisting of Ti, Co, W, Ni and Pt; and reduction of the native oxide layer to form low resistance contacts using a rapid thermal annealing process at a temperature of about 485° C. to 550° C.

17. The system as recited in claim 16, wherein excess silicon consumption is substantially reduced.

18. The system as recited in claim 16, wherein excess silicon consumption is reduced to approximately zero.

19. The system as recited in claim 16, wherein the metal layer is Ti.

* * * * *

UNITED STATES PATENT AND TRADEMARK OFFICE
CERTIFICATE OF CORRECTION

PATENT NO. : 6,734,099 B2
DATED : May 11, 2004
INVENTOR(S) : Jin Zhao, Jiong-Ping Lu and Yuqing Xu Page 1 of 1

It is certified that error appears in the above-identified patent and that said Letters Patent is hereby corrected as shown below:

<u>Title page,</u>
Item [73], Assignee, should read -- Texas Instruments Incorporated --

Signed and Sealed this

Thirtieth Day of November, 2004

JON W. DUDAS
*Director of the United States Patent and Trademark Office*